(12) United States Patent
Clevenger et al.

(10) Patent No.: US 6,444,516 B1
(45) Date of Patent: Sep. 3, 2002

(54) SEMI-INSULATING DIFFUSION BARRIER FOR LOW-RESISTIVITY GATE CONDUCTORS

(75) Inventors: Lawrence Alfred Clevenger, Lagrangeville, NY (US); Jack A. Mandelman, Stormville, NY (US); Rajarao Jammy, Wappinger Falls, NY (US); Oleg Gluschenkov, Poughkeepsie, NY (US); Irene Lennox McStay, Hopewell Junction, NY (US); Kwong Hon Wong, Wappinger Falls, NY (US); Johnathan Faltermeier, Lagrange, NY (US)

(73) Assignee: International Business Machines Corporation, Armonk, NY (US)

( * ) Notice: Subject to any disclaimer, the term of this patent is extended or adjusted under 35 U.S.C. 154(b) by 90 days.

(21) Appl. No.: 09/613,197

(22) Filed: Jul. 7, 2000

(51) Int. Cl.[7] ............................................. H01L 21/8234
(52) U.S. Cl. ....................................................... 438/238
(58) Field of Search ........................... 438/14, 15, 585, 438/625, 238

(56) References Cited

U.S. PATENT DOCUMENTS 6,001,729 A * 12/1999 Shinriki ....................... 438/625
6,054,345 A * 4/2000 Alsmeier ..................... 438/238

\* cited by examiner

*Primary Examiner*—John F. Niebling
*Assistant Examiner*—Andre C Stevenson
(74) *Attorney, Agent, or Firm*—Casey P. August; Gary M. Hartman; Domenica N. S. Hartman

(57) ABSTRACT

A gate structure for a semiconductor device, and particularly a MOSFET for such applications as CMOS technology. The gate structure entails an electrical insulating layer on a semiconductor substrate, over which a polysilicon gate electrode is formed. The gate structure further includes a gate conductor that is electrically connected with the gate electrode through a diffusion barrier layer having semi-insulating properties. The composition and thickness of the diffusion barrier layer are tailored so that the barrier layer is effective to block diffusion and intermixing between the gate conductor and polysilicon gate electrode, yet provides sufficient capacitive coupling and/or current leakage so as not to significantly increase the gate propagation delay of the gate structure.

20 Claims, 2 Drawing Sheets

US 6,444,516 B1

SEMI-INSULATING DIFFUSION BARRIER FOR LOW-RESISTIVITY GATE CONDUCTORS

BACKGROUND OF THE INVENTION

1. Field of the Invention

The present invention generally relates to transmission lines for microcircuits. More particularly, this invention relates to a diffusion barrier for low-resistance gate conductors for metal-oxide-semiconductor field-effect transistors (MOSFETs), in which the diffusion barrier is formed of a semi-insulating material that is able to prevent degradation of a gate conductor at high processing temperatures encountered during the fabrication of MOSFET and CMOS devices.

2. Description of the Prior Art

As known in the art, the gate of a field effect transistor (FET) typically includes a gate insulator over a semiconductor substrate, over which a polysilicon gate electrode is formed to which a voltage is applied to invert the surface of the substrate beneath the electrode, forming a channel through which electrons or holes flow from the source toward the drain of the transistor. The gate structure further includes a gate conductor that is electrically connected with the gate electrode, and by which the gate signal is delivered to the gate electrode. In addition to having low electrical resistance to minimize gate signal delay, the gate conductor of a MOSFET is often required to withstand high processing temperatures, for example, above 1050° C. for junction activation. This process integration constraint has necessitated a tradeoff between the conductivity and thermal stability of the gate conductor material. Gate conductors formed of tungsten or titanium suicides (TiSi$_x$) have low resistivities, on the order of about 15 to 20 micro-ohms·cm, but cannot withstand junction activation without degradation from interdiffusion with the polysilicon gate electrode, leading to a sharp increase in resistivity and/or causing a depletion of dopant from the gate electrode. Furthermore, TiSi$_x$ tends to agglomerate at temperatures above about 900° C., and pure tungsten reacts with polysilicon at temperatures above about 750° C. to form tungsten silicides (WSi$_x$), which exhibit high resistivities on the order of about 200 micro-ohms·cm, and therefore undesirably increase gate propagation delay. Even so, tungsten silicides are more thermally stable as compared to tungsten metal and titanium silicides, and are therefore employed as the material for gate conductors if processing temperatures will exceed the capability of tungsten and titanium silicide.

One known approach to prevent degradation of a gate structure having a tungsten gate conductor is to provide a diffusion barrier between the conductor and polysilicon electrode. In order to avoid undue delay in the gate signal, more current leakage through the diffusion barrier is better. Consequently, conventional wisdom has been to use conductive materials, such as TiN, TaSiN or tungsten nitride (WN$_x$) as the diffusion barrier material. However, conductive diffusion barrier materials such as TiN and TaSiN are limited to processing temperatures of less than about 900° C. in order to prevent breakdown of the material (TiN and WN$_x$) or prevent thermal oxidation of the material (TiN or TaSiN). Accordingly, conductive diffusion barrier materials currently available cannot withstand temperatures sufficient for junction activation and other high-temperature processes necessary in the fabrication of MOSFETs, or are otherwise not sufficiently oxidation resistant or compatible with integrated circuit manufacturing to successfully serve as a diffusion barrier for a gate electrode.

In view of the above, what is needed is a gate structure that is capable of withstanding processing temperatures above 900° C., and preferably at least 1050° C. for junction activation, without significantly increasing gate propagation delay.

BRIEF SUMMARY OF THE INVENTION

The present invention provides a gate structure for a semiconductor device, and particularly a MOSFET for such applications as CMOS technology. The gate structure of this invention can employ a gate conductor that has relatively low resistivity, e.g., tungsten or titanium silicide, yet remains thermally stable at processing temperatures above 900° C. As a result, the gate structure can exhibit low gate propagation delay while also being capable of withstanding high temperature processes such as junction activation.

As with conventional processes, the gate structure of this invention generally entails an electrical insulating layer on a semiconductor substrate, over which a polysilicon gate electrode is formed. The gate structure further includes a gate conductor that is electrically connected with the electrode via a diffusion barrier, which separates the gate electrode and gate conductor to prevent interdiffusion therebetween. Because the gate electrode voltage controls the speed of the transistor, the voltage drop across the diffusion barrier must be minimal in order to achieve a maximum switching speed for the transistor at a given swing of the gate voltage. For this reason, only highly conductive materials have been considered in the past as potential candidates for diffusion barrier of gate structures. Conductive materials such as metals and certain semimetals, metal silicides, metal nitrides, and doped semiconductors generally have resistivities in the range of about $10^{-6}$ to $10^{-2}$ ohms-cm. On the other hand, typical insulator materials have resistivities in the range of about $10^6$ to $10^{18}$ ohms-cm. A material having a resistivity between $10^{-2}$ and $10^6$ ohms-cm (i.e., between that of "good" conductor materials and "good" insulator materials) may be referred to as either an imperfect insulator or a poor conductor, depending of whether its resistivity is closer to that of an insulator or conductor material.

Contrary to conventional wisdom, the diffusion barrier of this invention is a very thin layer of a material with semi-insulating properties, which are defined by the ability of the diffusion barrier to allow for a flow of the leakage current (expressed in Amps per unit of area at a specified voltage). According to the invention, transistor speed is not significantly affected if the diffusion barrier provides sufficient capacitive coupling between the gate conductor and electrode, and/or allows sufficient leakage current from the gate conductor to the electrode. For example, a sufficient leakage current through a diffusion barrier is in the range of about $10^{-8}$ to 1 A/$\mu$m$^2$ based on one Volt bias across the barrier. Both leakage current and the degree of gate electrode charging due to capacitive coupling is increased as the thickness of the diffusion barrier is reduced.

In general, the leakage current may not be a linear function of the voltage across the diffusion barrier, such that barrier resistance and resistivity may depend on the voltage. Nevertheless, a comparison of the resistance, resistivity, and leakage current of semi-insulating materials at a specified voltage has demonstrated that very thin (e.g., about 0.5 to about 10 nm) semi-insulating (bulk resistivity of between $10^{-2}$ and $10^6$ ohms-cm) diffusion barriers have leakage currents within the above-noted desired range of $10^{-8}$ to 1 A/$\mu$m$^2$ at 1 Volt bias. In contrast, based on a typical contact resistance (resistance of unit contact area) of less than $10^{-8}$ ohm-cm$^2$, conventional conductive diffusion barriers have a leakage current of more than 1 A/$\mu$m$^2$ at 1 Volt bias. The same is true even for very thin (e.g., about 0.5 to about 10 nm) conductive diffusion barriers. Accordingly, the semi-insulating diffusion barriers of this invention are also distinguishable from conventional conductive diffusion barriers by having lower leakage currents.

The semi-insulating quality of the diffusion barrier of this invention can be achieved by employing one of several techniques or their combinations. In one approach, the thickness of a diffusion barrier formed of a good bulk insulator is optimized to allow for a sufficient tunneling current while preventing diffusion and intermixing of gate conductor and electrode materials during high-temperature processing. In another approach, the barrier material is formed of an insulating material that contains a large number of structural and chemical defects and/or dopants that increase electrical leakage but do not change the diffusion-inhibiting property of the barrier.

In view of the above, it can be appreciated that the present invention establishes that effective diffusion barriers for MOSFET gates can be formed from materials other than the highly conductive materials typically used in the prior art. In fact, diffusion barriers can be formed of very poor conductor (semi-insulating) materials with minimal effect on transistor speed. Accordingly, the invention is distinguishable from the prior art in part on the basis of the resistivity of the diffusion barrier, which allows for the use of a class of materials that includes, among others, thin tunneling insulators (also referred to as quantum conductive materials). As a result of the broader selection of materials that can be used for the gate diffusion barrier of this invention, and particularly semi-insulating materials capable of inhibiting diffusion at temperatures above 900° C., the present invention also allows for the use of gate conductors formed of low-resistivity but thermally unstable materials such as tungsten or TiSi$_x$, which would otherwise be susceptible to high-temperature interdiffusion with the polysilicon gate electrode if exposed to processing temperatures beyond the capability of prior art conductive diffusion barriers. As a result, the material for the gate conductor can be chosen on the basis of minimizing gate propagation delay, thereby improving the overall performance of the device without concern for interdiffusion and its consequences, e.g., thermal degradation of the gate structure, increase in resistivity of the conductor, and depletion of dopant from the gate electrode.

Other objects and advantages of this invention will be better appreciated from the following detailed description.

DETAILED DESCRIPTION OF THE INVENTION

Figure 1:
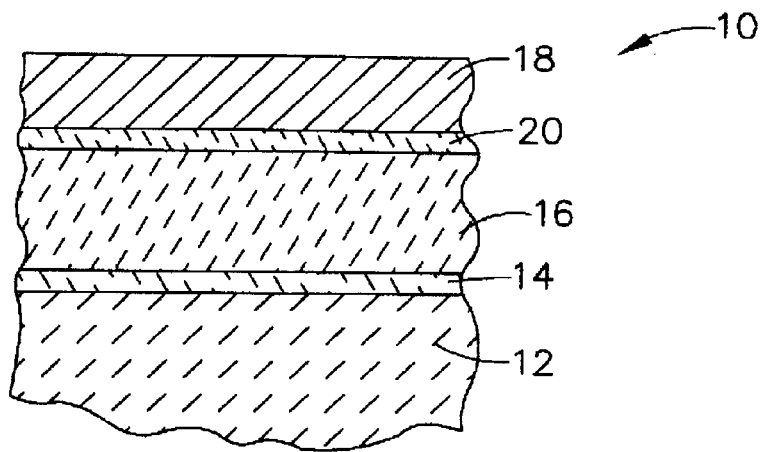
FIG. 1 represents a gate structure with a continuous semi-insulating diffusion barrier layer in accordance with this invention.

FIG. 1 represents an embodiment for a gate structure 10 in accordance with the present invention. As conventional, the gate structure 10 is built up on a semiconductor substrate 12 of silicon or another suitable semiconductor material. The portion of substrate 12 represented is generally that of the channel between a pair of doped islands (not shown) for the source and drain of a MOSFET. As is conventional, the gate structure includes a gate insulator 14, typically a thin layer of silicon dioxide. The gate insulator 14 insulates a polysilicon gate electrode 16 from the substrate 12. The final conventional component of the gate structure 10 is a gate conductor 18 that electrically contacts the gate electrode 16 in order to apply a positive or negative charge to the gate electrode 16, by which the desired electric field is generated to allow or interrupt current flow between the source and drain of the MOSFET. The processing steps necessary to form the gate structure 10 of FIG. 1 are within the knowledge of those skilled in the art, and therefore will not be discussed in any detail.

According to the present invention, the gate structure 10 further includes a semi-insulating diffusion barrier 20 between the gate electrode 16 and conductor 18. The function of the barrier 20 is to provide a physical barrier to interdiffusion between the electrode 16 and conductor 18 while providing for sufficient current leakage and/or capacitive coupling therebetween to charge the electrode 16. A feature of this invention is that the barrier 20 allows the use of highly conductive yet otherwise thermally unstable materials for the conductor 18, including tungsten, titanium silicide, cobalt and cobalt silicide. The barrier 20 is distinguishable from conductive diffusion barriers of the prior art in that its bulk property is that of an electrical insulator, instead of an electrical conductor, which allows for the use of a class of materials that includes, among others, thin tunneling insulators (quantum conductive materials). According to the invention, the prior constraint on the resistivity of the diffusion barrier 20 can be relaxed (i.e., higher resistivities are permitted) in part because a relatively small amount of charge is needed to charge the gate electrode 16, and a relatively small current leakage is needed to supply this charge during a desired switching/charging time. Another factor that allows the use of diffusion barrier materials with higher resistivity is that, because of its bulk insulating properties, the semi-insulating diffusion barrier 20 of this invention provides for capacitive coupling between the gate electrode 16 and conductor 18. The degree of gate electrode charging due to capacitive coupling is determined by the ratio of gate insulator capacitance to diffusion barrier capacitance. The larger the barrier capacitance with respect to the gate capacitance, the higher the degree of capacitive coupling. Since capacitance is inversely proportional to the thickness of an insulator, the thinner the diffusion barrier 20, the higher the degree of capacitive coupling. In the semi-insulating diffusion barrier 20 of the invention, both capacitive coupling and leakage contribute to charging of the gate electrode 16. In fact, both are affected positively (from the point of speed) if the thickness of the barrier 20 is reduced.

Because the resistivity requirement on the material for the diffusion barrier 20 is relaxed by this invention, new candidate materials are permitted to be considered and used as the diffusion barrier 20. Particularly suitable materials for the barrier 20 include silicon oxide (SiO$_2$), silicon nitride (SiN$_x$) and silicon oxynitride (SiN$_x$O$_y$). Each of these materials is considered a good insulator (e.g., resistivities greater than 10$^8$ ohm-cm) as far as its bulk electrical properties are concerned. However, as ultra thin films (less than twenty-five Angstroms), these materials (especially nitrides) are quite leaky due to tunneling, such that the diffusion barrier 20 is a quantum conductive film whose electrical conductivity depends on its film thickness. As a quantum conductive film, the barrier 20 of this invention becomes more electrically conductive as its thickness decreases, permitting current leakages therethrough of up to about 1 A/$\mu$m$^2$ for a one Volt bias. At thicknesses greater than about twenty-five Angstroms, negligible tunneling occurs and these materials are essentially insulating, though comparable current leakages can be achieved with film thicknesses of up to one hundred Angstroms if sufficient defects are present in the film material. For the same reason, the leakage current for a given film thickness can be increased through a diffusion barrier 20 formed of a semi-insulating material by introducing defects (damage) and/or dopants. One such method is to dope the diffusion barrier 20 by ion implantation of dopants (e.g. arsenic (As), phosphorous (P), or a metal) using a careful selection of energies and flux. Implantation may also be used to create defects (damage) that render the barrier 20 more previous to current flow.

From the above, it can be appreciated that the diffusion barrier 20 must satisfy two requirements: serve as a good barrier to diffusion between the gate electrode 16 and conductor 18, and allow for fast charging of the gate electrode 16. As discussed above, charging of the gate electrode 16 can be achieved with the semi-insulating barrier 20 of this invention by means of both leakage current through the barrier 20 and capacitive coupling between gate electrode 16 and conductor 18. If too thick, leakage current will be too low and the barrier layer 20 will behave as a small but high quality capacitor that leads to a large degradation in device performance. On the other hand, if highly conductive (excessive electrical leakage) the barrier layer 20 (as well as the gate conductor 18) becomes susceptible to thermal degradation at high temperatures, e.g., above 900° C., similar to prior art conducting diffusion barriers. Capacitive coupling between the gate electrode 16 and conductor 18 does not require any leakage through the barrier 20, but cannot charge the gate electrode 16 to the full potential of the gate conductor 18. Instead, capacitive coupling rapidly charges the gate electrode 16 to a voltage lower than that of the gate conductor 18. This voltage is defined by the ratio of the capacitances of the gate insulator 14 to the diffusion barrier 20. If V1 is the voltage drop across the barrier 20, V2 is the voltage drop across the gate insulator 14, and V is the gate conductor voltage (such that V=V1+V2), then V2=V·$C_b/(C_{in}+C_b)$ where $C_b$ is the capacitance of the barrier 20 and $C_{in}$, is the capacitance of the gate insulator 14. V2 is the potential of the gate electrode 16 if there is only capacitive coupling (no leakage current) between the gate conductor 18 and the gate electrode 16.

In view of the above, capacitive coupling and electrical leakage through the barrier 20 will impact gate propagation delay, and therefore device performance. Also affecting gate propagation delay are the geometrical effects attributable to the distributed nature of the capacitance and resistance of the conductive line to the conductor 18. In order to understand the impact of each of these influences, a simple distributed model was developed and evaluated using a SPICE simulation to determine charging time of the gate electrode, in which barrier thickness, and therefore current leakage and capacitive coupling, was the variable parameter. For this analysis, tungsten (sheet resistance of 6 ohms/square) was selected as the low-resistance material for the gate conductor, and silicon nitride was selected as the semi-insulating material for a continuous semi-insulating diffusion barrier between the gate conductor and electrode. The line width and length of the conductor was 0.2 and 100 micrometers, respectively. Diffusion barrier thicknesses of five, six, seven, ten and twenty angstroms were evaluated, with leakage currents ranging from about $10^{-7}$ to $10^{-2}$ A/$\mu$m$^2$. Polysilicon (sheet resistance of about 150 ohms/square) was selected as the material for the gate electrode. The gate insulator was a silicon dioxide film having a thickness of about fifty-five angstroms.

Figure 2:
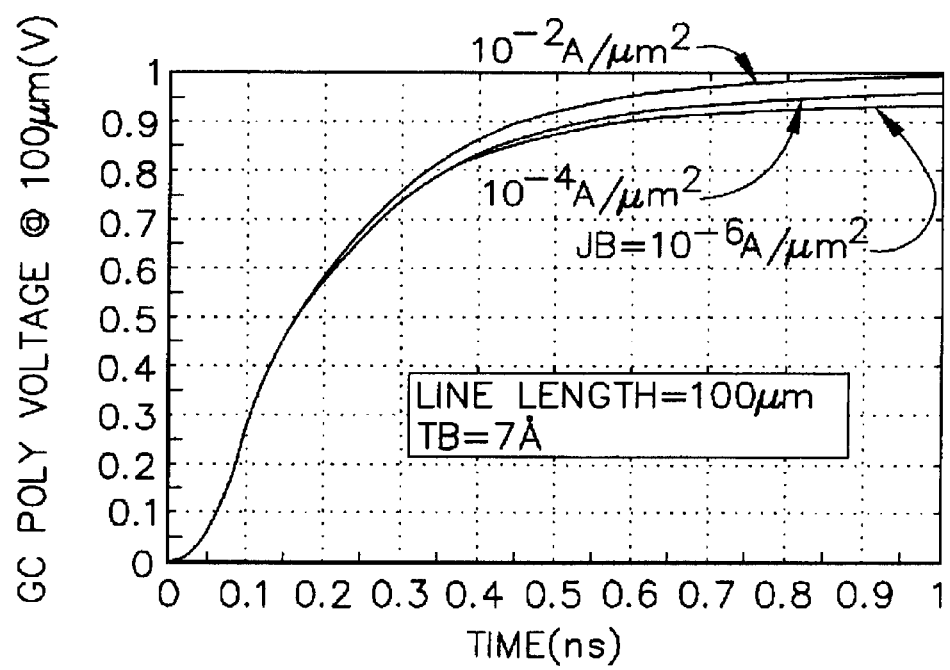
FIG. 2 is a graph that represents the transient responses of gate structures of differing current leakages when subject to a step voltage of one volt.
Figure 3:
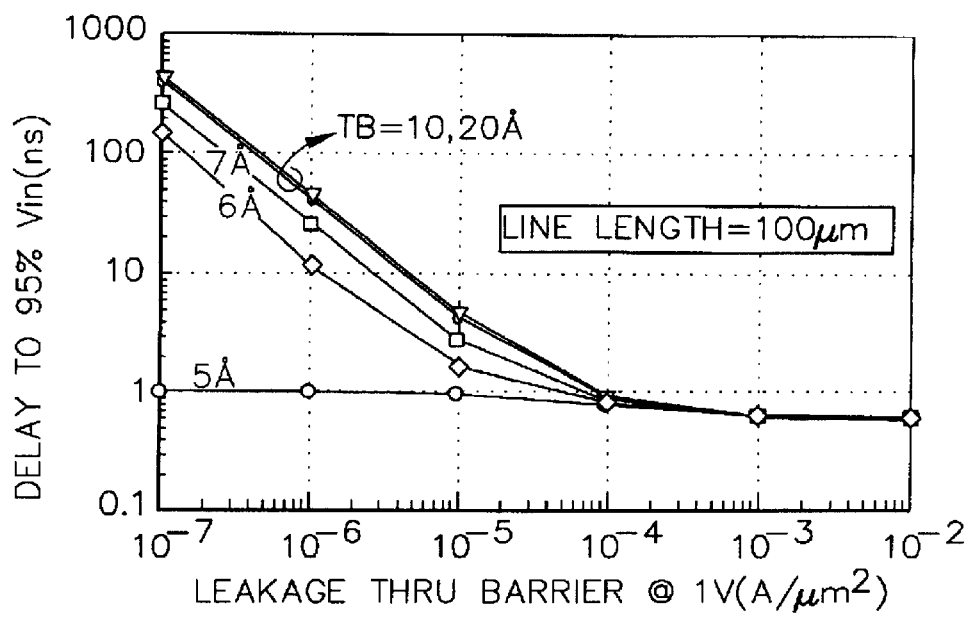
FIG. 3 is a graph that relates gate propagation delay to current leakage through semi-insulating diffusion barrier layers of different thicknesses.

FIG. 2 is illustrative of three transient responses for semi-insulating diffusion barriers with thicknesses ("TB") of about seven angstroms and leakage currents ("JB") of $10^{-2}$, $10^{-4}$ or $10^{-6}$ A/$\mu$m$^2$ as a result of different leakage levels obtained by controlling the defect distribution (i.e., defect size and density) in the film. A step voltage of one Volt was used to generate the transient responses that produced the data plotted in FIG. 2. The data represented in FIG. 3 were extracted from plots similar to the one shown in FIG. 2, but for five semi-insulating diffusion barriers with thicknesses of five, six, seven, ten and twenty Angstroms. FIG. 3 shows the rise time of a gate electrode defined at 95% of the applied voltage, and evidences that, for thicknesses of about five Angstroms and less, only a slight change in gate delay occurs over a broad range of leakage currents ($10^{-7}$ to $10^{-2}$ A/$\mu$m$^2$). In contrast, for thicknesses of above five Angstroms, a significant change in gate delay occurs for leakage currents of less than $10^{-4}$ A/$\mu$m$^2$. Therefore, FIG. 3 evidences that in the case of a 5 Å barrier, a 95% voltage swing can be achieved with capacitive coupling only, while both capacitive coupling and leakage current are needed to reach a comparable voltage swing with thicker semi-insulating barriers. Accordingly, gate propagation delay does not substantially depend on the barrier leakage current over the entire leakage range of a 5 Å barrier, while in the case of a 6 Å (or thicker) barrier the delay is substantially increased if a leakage current below about $10^{-4}$ A/$\mu$m$^2$ is present. In general, FIG. 3 evidenced that for films significantly thinner than 6 Å (i.e., 5 Å and thinner), gate propagation delay is dominated by capacitive coupling, and the leakage of the film is not particularly important.

The definition of rise time employed for FIG. 3 was arbitrary and for investigation purposes only. In practice, the level of voltage at which the rise (or delay) time is defined would be set by a specific circuit design and may vary from circuit to circuit. FIG. 2 clearly shows that if the delay (rise) time were defined at 90% of applied voltage, there would be a much smaller difference between the delays expected at different barrier leakage currents than that shown in FIG. 3. Accordingly, the breakout point in FIG. 3 would shift from about $10^{-4}$ A/$\mu$m$^2$ to a much lower value.

Figure 4:
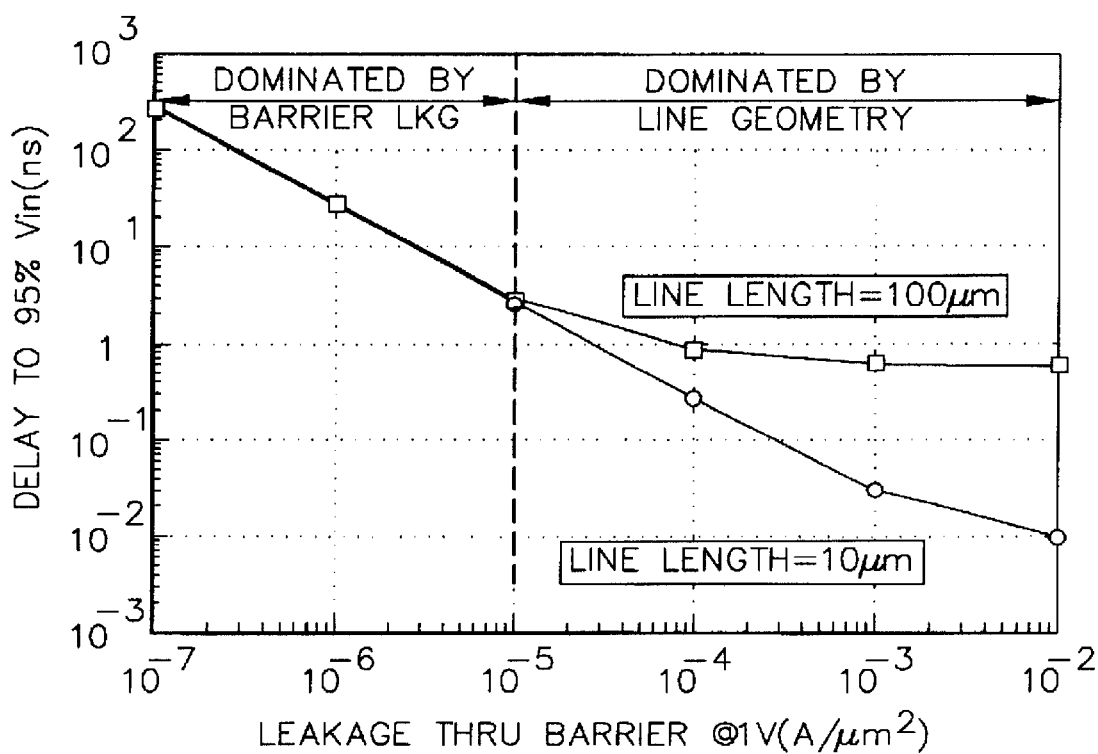
FIG. 4 is a graph that relates the influence that current leakage has on gate propagation delay for semi-insulating diffusion barrier layers of this invention.

FIG. 4 demonstrates the geometrical effects attributable to the distributive nature of resistances and capacitances of gate stacks that include the semi-insulating diffusion barrier of this invention. At lower barrier leakage currents, the delay is determined by the barrier leakage only. However, at higher barrier leakage currents the delay also depends on line length. From FIG. 4, it was concluded that increased barrier leakage (i.e., at least $10^{-5}$ A/$\mu$m$^2$) is useful for reducing propagation delay for line lengths shorter than about 100 micrometers.

In view of the above, it can be appreciated that one technique for achieving a suitably high leakage current through the semi-insulating diffusion barrier 20 of this invention is to limit the thickness of the barrier 20, with suitable thicknesses believed to be less than twenty-five Angstroms, such that quantum mechanical tunneling phenomena produces a substantial leakage current. The exact thickness at which the tunneling current rakes off will depend on the barrier material. For example, to achieve the same density of tunneling current, a silicon nitride barrier 20 would be made thicker than a silicon oxide barrier 20. The relation of tunneling current to material properties such as bandgap alignment and effective mass is well known in the art.

Another technique for increasing current leakage through an otherwise insulating barrier 20 of this invention is to introduce defects and/or dopants into the barrier 20. Both defects and dopants can either boost tunneling by reducing the tunneling barrier for the carriers, or enhance a so-called hopping conduction which is due to carrier hopping from defect to defect or from dopant to dopant. One way of introducing dopants into an insulating barrier 20 is to provide a source of dopants during formation of the barrier 20. If the barrier 20 is formed by vapor phase deposition, the source of dopants would typically be supplied during deposition in the form of a source gas. If the barrier 20 is formed by reacting solid films, a solid source of dopants in the vicinity of the reaction zone would be used (normally, as part of at least one of the reacting films). Dopants can also be introduced into the barrier 20 after gate stack deposition by means of ion implantation, by which the ion energy is adjusted such that ions penetrate the gate conductor 18 and stop in or around the diffusion barrier 20. Most metals are known to increase leakage in insulating films and, therefore, could be used as dopants. Large dopant atoms may also produce structural damage and, thus, increase leakage. For example, arsenic and phosphorous are relatively large atoms that are widely used as silicon dopants. Due to their size and silicon processing compatibility, arsenic and phosphorous are believed to be particularly suitable candidates for insulator doping.

The present invention has demonstrated the ability of semi-insulating materials (resistivities above $10^{-2}$ ohms-cm) to serve as diffusion barriers for gate structures of field effect transistors, in contrast to the conventional wisdom that gate diffusion barriers must be formed from conductive materials (resistivities of about $10^{-6}$ to $10^{-2}$ ohms-cm.) in order to avoid a substantial increase in gate propagation delay (i.e., a reduction of the gate electrode charging rate). However, semi-insulating barriers must satisfy several requirements in order not to substantially degrade the charging speed and the voltage swing of the gate electrode. A gate electrode swing that is less than 75% of the applied voltage step may be considered impractical, since a 25% reduction of the gate electrode voltage would substantially degrade the drive current of a MOS transistor. SPICE simulation has shown that in spite of the distributed nature of line capacitance and resistance, there is a capacitive coupling between gate conductor and gate electrode over the entire range of barrier leakage current. This simulation also showed that, as noted previously, the contribution to gate electrode voltage attributable to capacitive coupling can be approximated through the ratio of barrier and gate insulator capacitances per unit area. Therefore, the requirement that the gate electrode voltage is higher than 75% can be expressed in terms of barrier and gate insulator thicknesses and dielectric permittivities as $$t_{db} < t_i \epsilon_{db} / 3 \epsilon_i$$

where $t_{db}$ is the thickness of the diffusion barrier 20 in Angstroms, $t_i$ is the thickness of the gate insulator 14 in Angstroms, $\epsilon_{db}$ is the permittivity of the diffusion barrier 20, and $\epsilon_i$ is the permittivity of the insulator 14.

If one wishes to achieve a 95% of applied voltage swing on the gate electrode 16, the above formula can be rewritten to achieve a higher capacitance ratio and, therefore, a thinner barrier with a higher dielectric permittivity. For example, the diffusion barrier with a thickness of five Angstroms in FIG. 3 satisfies such criteria, while a barrier with a thickness of six Angstroms does not. Importantly, the diffusion barrier 20 of this invention cannot be made arbitrary thin. While the theoretical thickness limit would be the thickness of one monolayer of atoms (about three to five Angstroms), a more practical limit is about six to twenty Angstroms. The actual limit would be identified in each specific case by determining the ability of the thin barrier 20 to withstand a particular thermal budget so as to prevent undesirable diffusion and intermixing of the gate conductor and gate insulator materials. Since the dielectric permittivity of the barrier 20 cannot be arbitrary increased, there may be a situation that at a given thickness and dielectric permittivity of the gate insulator 14, the requirement on the barrier thickness cannot be satisfied. In this situation, in order to achieve a desired voltage swing on the gate electrode 16, one must rely on both leakage current and capacitive coupling. Furthermore, the leakage current must be relatively high so as not to introduce a large delay due to a slow rate of gate electrode charging at low leakage currents. For example, FIG. 3 shows that the 95% rise time will not be substantially affected if the leakage current is larger than $10^{-4}$ A/$\mu$m$^2$, independent of the barrier thickness. Even though the barrier 20 can be made arbitrarily thick for a specified leakage, there are several practical limitations on its maximum thickness. For example, a diffusion barrier 20 that is thicker than fifty Angstroms may substantially contribute to the overall gate stack height. Thicker gate stacks are generally undesirable due to an increased aspect ratio of the patterned gate.

While our invention has been described in terms of a preferred embodiment, it is apparent that other forms could be adopted by one skilled in the art. Accordingly, the scope of our invention is to be limited only by the following claims.

What is claimed is:

1. A semiconductor device formed in a semiconductor substrate, the semiconductor device comprising:
    an electrical insulating layer on the substrate;
    a gate electrode on the electrical insulating layer;
    a semi-insulating diffusion barrier layer on the electrode, the diffusion barrier layer having a resistivity above $10^{-2}$ ohms-cm; and
    a conductor contacting the diffusion barrier layer and separated from the gate electrode by the diffusion barrier layer so that the conductor makes electrical contact with the electrode through the diffusion barrier layer and a gate electrode charge is induced in the electrode by applying a voltage to the conductor;
    wherein the diffusion barrier layer has a sufficient thickness to effectively block diffusion and intermixing between the conductor and electrode.

2. A semiconductor device according to claim 1, wherein the diffusion barrier layer has a thickness in angstroms of less than:

$$t_i \epsilon_{db} / 3 \epsilon_i$$

where $t_i$ is the thickness of the insulating layer in angstroms, $\epsilon_{db}$ is the permittivity of the diffusion barrier layer, and $\epsilon_i$ is the permittivity of the insulating layer.

3. A semiconductor device according to claim 1, wherein the diffusion barrier layer has a current leakage of less than 1 A/$\mu$m$^2$ when subjected to a one Volt bias.

4. A semiconductor device according to claim 1, wherein the diffusion barrier layer has a current leakage of $10^{-8}$ to 1 A/$\mu$m$^2$ when subjected to a one Volt bias.

5. A semiconductor device according to claim 1, wherein the diffusion barrier layer is a quantum conductive material and the thickness thereof is less than 25 angstroms.

6. A semiconductor device according to claim 1, wherein the diffusion barrier layer is formed of a material selected from the group consisting of silicon oxide, silicon nitride and silicon oxynitride.

7. A semiconductor device according to claim 6, wherein the thickness of the diffusion barrier layer is less than 25 angstroms.

8. A semiconductor device according to claim 1, wherein the diffusion barrier layer is doped with one or more dopants chosen from the group consisting of arsenic, phosphorous and metals.

9. A semiconductor device according to claim 1, wherein the thickness of the diffusion barrier layer is sufficiently thin to cause charging of the electrode by capacitively coupling between the conductor and the electrode.

10. A semiconductor device according to claim 9, wherein the thickness of the diffusion barrier layer is about 5 Angstroms or less.

11. A semiconductor device according to claim 9, wherein capacitive coupling accounts for substantially all of the gate electrode charge.

12. A semiconductor device according to claim 1, wherein the gate electrode charge is at least 75% of the voltage applied to the conductor.

13. A semiconductor device according to claim 1, wherein the thickness of the diffusion barrier layer is sufficient to effectively block diffusion and intermixing between the conductor and electrode at temperatures above 900° C.

14. A semiconductor device according to claim 1, wherein the conductor is a material chosen from the group consisting of tungsten, titanium silicide, cobalt and cobalt silicide.

15. A semiconductor device according to claim 1, wherein the semiconductor device is a MOSFET formed in a silicon substrate, the electrical insulating layer is a gate oxide layer of the MOSFET, the electrode is a gate electrode of the MOSFET, and the conductor is a gate conductor of the MOSFET.

16. A semiconductor device formed in a semiconductor substrate, the semiconductor device comprising:

an electrical insulating layer on the substrate;

a gate electrode on the electrical insulating layer;

a semi-insulating diffusion barrier layer on the electrode, the semi-insulating diffusion barrier layer having a resistivity above $10^{-2}$ ohms-cm and a thickness in Angstroms of less than:

$$t_i \epsilon_{db}/3\epsilon_i$$

where $t_i$ is the thickness of the insulating layer in Angstroms, $\epsilon_{db}$ is the permittivity of the diffusion barrier layer, and $\epsilon_i$ is the permittivity of the insulating layer, and a conductor contacting the diffusion barrier layer so as to electrically contact the electrode, such that a gate electrode charge is induced in the electrode by applying a voltage to the conductor, wherein the diffusion barrier layer has a sufficient thickness to effectively block diffusion and intermixing between the conductor and electrode.

17. A semiconductor device formed in a semiconductor substrate, the semiconductor device comprising:

an electrical insulating layer on the substrate;

a gate electrode on the electrical insulating layer;

a semi-insulating diffusion barrier layer on the electrode, the diffusion barrier layer being formed of a quantum conductive material, having a thickness of less than 25 Angstroms, and having a resistivity above $10^{-2}$ ohms-cm; and a conductor contacting the diffusion barrier layer so as to electrically contact the electrode, such that a gate electrode charge is induced in the electrode by applying a voltage to the conductor;

wherein the diffusion barrier layer has a sufficient thickness to effectively block diffusion and intermixing between the conductor and electrode.

18. A semiconductor device formed in a semiconductor substrate, the semiconductor device comprising:

an electrical insulating layer on the substrate;

a gate electrode on the electrical insulating layer;

a semi-insulating diffusion barrier layer on the electrode, the semi-insulating diffusion barrier layer formed of a material selected from the group consisting of silicon oxide, silicon nitride and silicon oxynitride, having a thickness of less than 25 Angstroms, and having a resistivity above $10^{-2}$ ohms-cm; and a conductor contacting the diffusion barrier layer so as to electrically contact the electrode, such that a gate electrode charge is induced in the electrode by applying a voltage to the conductor;

wherein the diffusion barrier layer has a sufficient thickness to effectively block diffusion and intermixing between the conductor and electrode.

19. A semiconductor device formed in a semiconductor substrate, the semiconductor device comprising:

an electrical insulating layer on the substrate;

a gate electrode on the electrical insulating layer;

a semi-insulating diffusion barrier layer on the electrode, the semi-insulating diffusion barrier layer having a resistivity above $10^{-2}$ ohms-cm and having a thickness of 5 Angstroms or less; and a conductor contacting the diffusion barrier layer so as to electrically contact the electrode, such that a gate electrode charge is induced in the electrode by applying a voltage to the conductor;

wherein the diffusion barrier layer has a sufficient thickness to effectively block diffusion and intermixing between the conductor and electrode, and is sufficiently thin to cause charging of the electrode by capacitively coupling between the conductor and the electrode.

20. A semiconductor device formed in a semiconductor substrate, the semiconductor device comprising:

an electrical insulating layer on the substrate;

a gate electrode on the electrical insulating layer;

a semi-insulating diffusion barrier layer on the electrode, the semi-insulating diffusion barrier layer having a resistivity above $10^{-2}$ ohms-cm; and a conductor contacting the diffusion barrier layer so as to electrically contact the electrode, such that a gate electrode charge is induced in the electrode by applying a voltage to the conductor, the gate electrode charge being at least 75% of the voltage applied to the conductor;

wherein the diffusion barrier layer has a sufficient thickness to effectively block diffusion and intermixing between the conductor and electrode.

* * * * *